(12) United States Patent
Chua

(10) Patent No.: US 11,054,593 B1
(45) Date of Patent: Jul. 6, 2021

(54) CHIP-SCALE OPTOELECTRONIC TRANSCEIVER WITH MICROSPRINGED INTERPOSER

(71) Applicant: Palo Alto Research Center Incorporated, Palo Alto, CA (US)

(72) Inventor: Christopher L. Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/815,932

(22) Filed: Mar. 11, 2020

(51) Int. Cl.
| | |
|---|---|
| G02B 6/42 | (2006.01) |
| H04B 10/25 | (2013.01) |
| H01L 23/498 | (2006.01) |
| H04B 10/40 | (2013.01) |
| H01L 31/12 | (2006.01) |

(52) U.S. Cl.
CPC .......... *G02B 6/4278* (2013.01); *G02B 6/423* (2013.01); *G02B 6/4246* (2013.01); *H01L 23/49811* (2013.01); *H01L 31/12* (2013.01); *H04B 10/25* (2013.01); *H04B 10/40* (2013.01)

(58) Field of Classification Search
CPC .... G02B 6/4278; G02B 6/4246; G02B 6/423; H01L 23/49811; H01L 31/12; H04B 10/25; H04B 10/40
See application file for complete search history.

(56) References Cited

U.S. PATENT DOCUMENTS

| | | | | |
|---|---|---|---|---|
| 6,213,789 B1 * | 4/2001 | Chua | .................. | H01L 21/563 257/E21.503 |
| 6,439,898 B2 * | 8/2002 | Chua | .................. | H01L 21/563 257/E21.503 |
| 6,450,704 B1 * | 9/2002 | O'Connor | ............ | G02B 6/4201 385/52 |
| 6,456,766 B1 * | 9/2002 | Shaw | ...................... | G02B 6/30 385/47 |
| 6,556,737 B1 * | 4/2003 | Miu | ................... | B81C 1/00182 359/224.1 |
| 6,600,853 B2 * | 7/2003 | Wickman | ............. | G02B 6/4249 385/24 |

(Continued)

OTHER PUBLICATIONS

Li et al., "Silicon Interposer Based QSFP-DD Transceiver Demonstrator with >10 Gbps/mm2 Bandwidth Density", IEEE, 2018, 5 pages.

(Continued)

*Primary Examiner* — Andrew Jordan
(74) *Attorney, Agent, or Firm* — Mueting Raasch Group

(57) ABSTRACT

A chip-scale transceiver includes an interposer having microspring electrical contacts disposed on the interposer substrate. At least one electronic chip and at least one optoelectronic chip are electrically coupled to the interposer through the microsprings. The electronic chip includes at least one of an amplifier array and a laser driver array. First electrical contact pads arranged to make electrical contact with the first microsprings of the interposer. The optoelectronic chip includes at least one of a laser array and a photodetector array. Second electrical contact pads arranged to make electrical contact with the second microsprings of the interposer are disposed on the optoelectronic chip substrate. The transceiver has an area less than or equal to 0.17 $mm^2$ per Gbps.

20 Claims, 10 Drawing Sheets

(56) References Cited

U.S. PATENT DOCUMENTS

| | | | | |
|---|---|---|---|---|
| 6,642,068 B1* | 11/2003 | Hayes | ............... | G02B 6/32 438/21 |
| 6,749,345 B1* | 6/2004 | Gee | ............... | G02B 6/421 385/75 |
| 6,794,725 B2* | 9/2004 | Lemmi | ............... | B41J 2/45 257/414 |
| 6,910,812 B2 | 6/2005 | Pommer et al. | | |
| 7,042,015 B2* | 5/2006 | Sun | ............... | B41J 2/45 257/80 |
| 7,648,287 B2 | 1/2010 | Epitaux et al. | | |
| 7,867,688 B2* | 1/2011 | Phillips | ............... | G03F 1/00 430/270.1 |
| 8,231,284 B2* | 7/2012 | Doany | ............... | G02B 6/43 385/92 |
| 8,441,808 B2 | 5/2013 | Chow | | |
| 8,519,534 B2 | 8/2013 | Chow et al. | | |
| 8,559,474 B2 | 10/2013 | Andry et al. | | |
| 8,971,676 B1* | 3/2015 | Thacker | ............... | G02B 6/12 385/14 |
| 9,250,403 B2* | 2/2016 | Thacker | ............... | G02B 6/4274 |
| 9,256,026 B2* | 2/2016 | Thacker | ............... | G02B 6/12 |
| 9,297,971 B2* | 3/2016 | Thacker | ............... | H01L 25/0655 |
| 9,373,934 B2* | 6/2016 | Lin | ............... | H01S 5/141 |
| 9,671,572 B2* | 6/2017 | Decker | ............... | G02B 6/4204 |
| 9,678,271 B2* | 6/2017 | Thacker | ............... | G02B 6/4257 |
| 9,709,746 B2* | 7/2017 | Heroux | ............... | G02B 6/29368 |
| 10,004,458 B2* | 6/2018 | Toth | ............... | A61B 5/6852 |
| 10,168,482 B2* | 1/2019 | Heroux | ............... | G02B 6/29368 |
| 10,215,938 B2 | 2/2019 | Chang et al. | | |
| 10,739,518 B2* | 8/2020 | Heroux | ............... | G02B 6/4215 |
| 10,765,370 B2* | 9/2020 | Toth | ............... | A61B 5/4875 |
| 2002/0003231 A1* | 1/2002 | Sun | ............... | B41J 2/45 257/59 |
| 2002/0034351 A1* | 3/2002 | Wickman | ............... | G02B 6/4249 385/2 |
| 2002/0041740 A1* | 4/2002 | O'Connor | ............... | G02B 6/4201 385/89 |
| 2002/0061159 A1* | 5/2002 | Dahmani | ............... | G02B 6/3572 385/18 |
| 2002/0197024 A1* | 12/2002 | O'Connor | ............... | G02B 6/4259 385/89 |
| 2003/0019838 A1* | 1/2003 | Shaw | ............... | G02B 6/3636 216/20 |
| 2003/0057533 A1* | 3/2003 | Lemmi | ............... | H01L 25/0753 257/678 |
| 2003/0219217 A1* | 11/2003 | Wickman | ............... | G02B 6/4249 385/89 |
| 2007/0281247 A1* | 12/2007 | Phillips | ............... | G03F 1/00 430/311 |
| 2012/0163811 A1* | 6/2012 | Doany | ............... | G02B 6/43 398/41 |
| 2012/0207426 A1 | 8/2012 | Doany et al. | | |
| 2014/0321803 A1* | 10/2014 | Thacker | ............... | H01L 25/0652 385/14 |
| 2014/0321804 A1* | 10/2014 | Thacker | ............... | H01L 25/0655 385/14 |
| 2015/0098677 A1* | 4/2015 | Thacker | ............... | G02B 6/428 385/14 |
| 2015/0280403 A1* | 10/2015 | Lin | ............... | H01S 5/02326 359/341.1 |
| 2016/0029960 A1* | 2/2016 | Toth | ............... | A61B 5/4041 600/301 |
| 2016/0085038 A1* | 3/2016 | Decker | ............... | G02B 6/428 385/14 |
| 2016/0216445 A1* | 7/2016 | Thacker | ............... | H01L 25/167 |
| 2017/0139144 A1* | 5/2017 | Heroux | ............... | G02B 6/29368 |
| 2017/0176683 A1* | 6/2017 | Heroux | ............... | G02B 6/32 |
| 2017/0269305 A1* | 9/2017 | Heroux | ............... | G02B 6/29364 |
| 2018/0249958 A1* | 9/2018 | Toth | ............... | A61B 5/24 |
| 2020/0359965 A1* | 11/2020 | Toth | ............... | A61B 5/685 |

OTHER PUBLICATIONS

Kimerling, "Electronic-Photonic Integration", AIM Photonics Institute, 2018, 44 pages.

Mohammed et al., "Optical hybrid package with an 8-channel 18GT/s CMOS transceiver for chip-to-chip optical interconnect", Photonics Packaging, Integration, and Interconnects VIII, Proc, of SPIE, vol. 6899, 2008, 11 pages.

Palomar Technologies, Active Optical Cable Transceiver Packaging Trends and Die Bonding Case Studies, 9 pages.

* cited by examiner

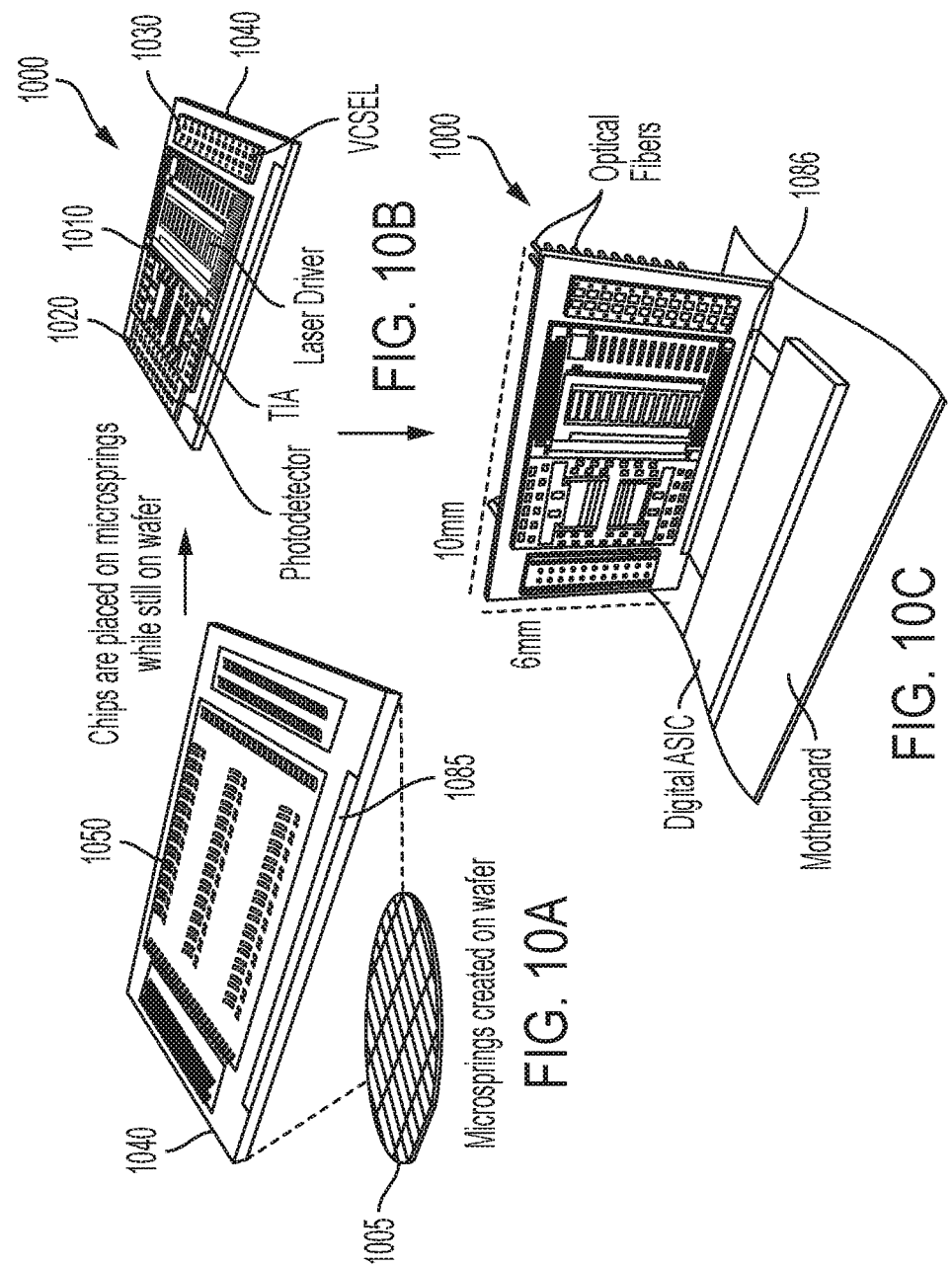

CHIP-SCALE OPTOELECTRONIC TRANSCEIVER WITH MICROSPRINGED INTERPOSER

BACKGROUND

Optical communication uses light to carry information. Optical communication systems use transmitters to encode a message and to convert it to an optical signal. The message is transmitted over a channel which is typically an optical fiber. An optical receiver receives the transmitted optical signal and converts the optical signal to an electronic signal that is decoded to extract the message.

BRIEF SUMMARY

Some embodiments are directed to a chip-scale transceiver that includes an interposer having microspring electrical contacts disposed on the interposer substrate. At least one electronic chip and at least one optoelectronic chip are disposed on the interposer. The electronic chip includes an electronic chip substrate with electronic devices disposed in and/or on the surface of the electronic chip substrate. The electronic devices include at least one of an amplifier array and a laser driver array. First electrical contact pads are disposed on the electronic chip substrate. The first electrical contact pads are arranged to make electrical contact with the first microsprings of the interposer. The optoelectronic chip includes an optoelectronic chip substrate with optoelectronic devices disposed in and/or on the surface of the optoelectronic chip substrate, wherein the optoelectronic devices comprise at least one of a laser array and a photodetector array. Second electrical contact pads are disposed on the optoelectronic chip substrate, the second electrical contact pads arranged to make electrical contact with the second microsprings of the interposer. The transceiver has an area less than or equal to 0.17 mm$^2$ per Gbps.

Some embodiments involve a communication system that includes the transceiver described in the paragraph immediately above. The communication system also includes a network interface device configured to control operation of the transceiver. A motherboard comprises a first connector configured to electrically connect to the transceiver and a second connector configured to electrically connect to the network interface device, the motherboard having electrical traces configured to electrically connect the network interface device to the transceiver.

Some embodiments are directed to a method of making a chip-scale transceiver. Multiple interposers are formed on an interposer wafer, each interposer comprises first and second stress-engineered microspring electrical contacts disposed on a surface of the interposer wafer. At least on electronic chip is formed. Formation of the electronic chip includes fabricating electronic devices in and/or on a surface of an electronic chip substrate, the electronic devices comprising at least one of an amplifier array and a laser driver array. First electrical contact pads are fabricated on the electronic chip substrate. The first electrical contact pads are arranged to make electrical contact with the first microsprings of the interposer. At least one optoelectronic chip is formed. Formation of the optoelectronic chip includes fabricating optoelectronic devices in and/or on a surface of an optoelectronic chip substrate. The optoelectronic devices comprising at least one of a photodetector array and a laser array. A second set of contact pads are fabricated on the electronic chip substrate. The second electrical contact pads are arranged to make electrical contact with the first microsprings of the interposer. The area of the transceiver is less than or equal to 0.17 mm$^2$ per Gbps.

BRIEF DESCRIPTION OF DRAWINGS

FIGS. 10A through 10C are a sequence of diagrams illustrating the formation of the communication system of FIG. 9.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Current commercial optical links are based on discrete pluggable modules that typically are mounted on faceplates of equipment boxes, far from network interface electronics which are commonly located on printed circuit boards (PCBs) inside the equipment boxes. Consequently, over 50% of the energy needed for transmitting bits is consumed by data conditioning and interface electronics that sit between the faceplate-mounted optoelectronic elements that transmit and receive optical signals and the network switch application-specific integrated circuit (ASIC) chip on a motherboard inside the equipment box. Examples of these energy-hungry interface components include clock data recovery (CDR) electronics, data pre-emphasis electronics, trans-impedance amplifiers (TIA), and laser driver electronics. This large energy loss limits the scale, cost, and performance of datacenters.

This disclosure describes a highly integrated optoelectronic transceiver that eliminates the usual face-plate pluggable optical modules of legacy designs. The approach moves the optoelectronic elements "into the equipment box" and provides optical input/output (I/O) capability down to the multi-chip module (MCM)-level. Some embodiments of the optoelectronic transceiver discussed herein are fabricated via wafer-level chip-scale co-packaging of optical and electronics chips using microfabricated springs. Connection pluggability is maintained to ensure that the I/O technology retains compatibility with a wide variety of existing IC cores, but the plugged interface components are now small-sized, non-heat-producing, passive optical fibers that can be packed at high density at the connector location to support high interface bandwidth density.

The discrete nature of legacy face-plate pluggable optical transceivers leads to high packaging cost and low I/O packing density. In contrast, the disclosed integrated hybrid transceivers are formed using wafer-scale packaging, resulting in much lower manufacturing cost.

Figure 1A:
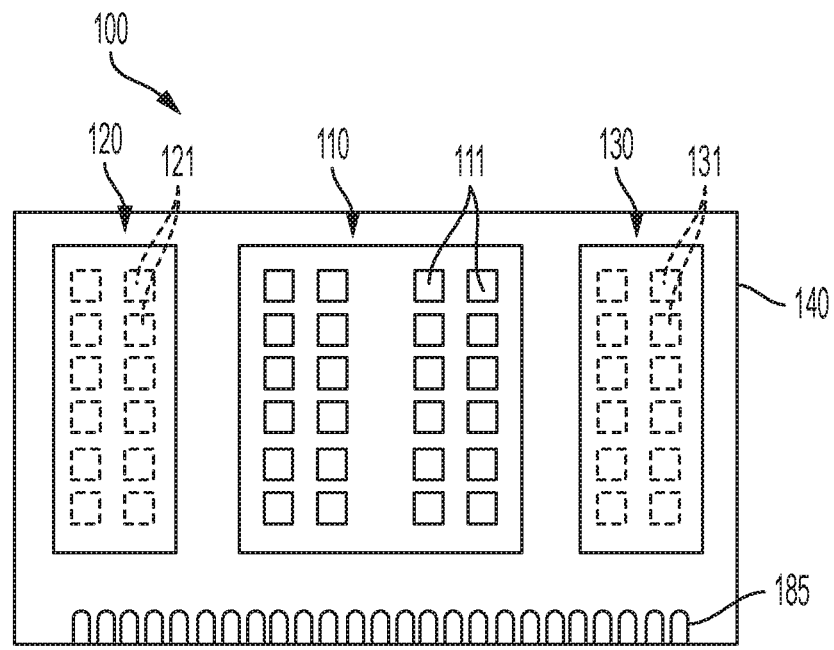
FIG. 1A shows a plan view of a chip-scale optoelectronic transceiver in accordance with some embodiments.
Figure 1B:
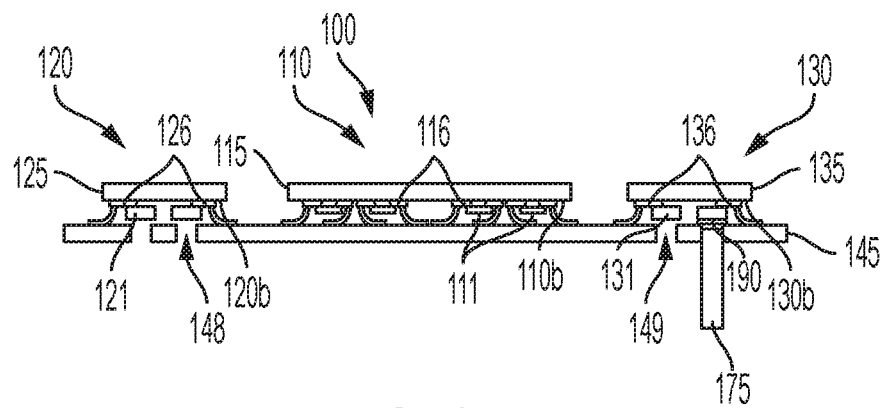
FIG. 1B shows a side cross sectional view of the transceiver of FIG. 1A.

FIGS. 1A and 1B show plan (FIG. 1A) and side cross sectional (FIG. 1B) views of a chip-scale optoelectronic transceiver 100 in accordance with some embodiments. The transceiver 100 includes at least one optoelectronic chip 120, 130 and at least one electronic chip 110 disposed on an interposer 140. In the illustrated embodiment, the transceiver includes two optoelectronic chips—an optoelectronic receiver chip 120, e.g., including a photodetector array, and an optoelectronic transmitter chip 130, e.g., including a laser or laser diode array. The electronic chip 110 includes amplifier and driver circuitry to support the optical receiver and transmitter functions.

Figure 2A:
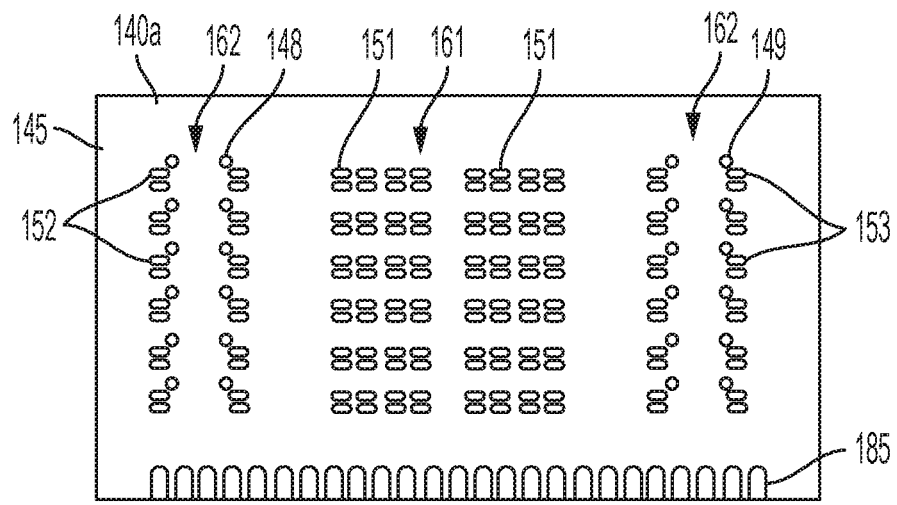
FIG. 2A is a plan view of the top surface of the interposer of the transceiver of FIG. 1A before the electronic and optoelectronic chips are placed thereon.
Figure 2B:
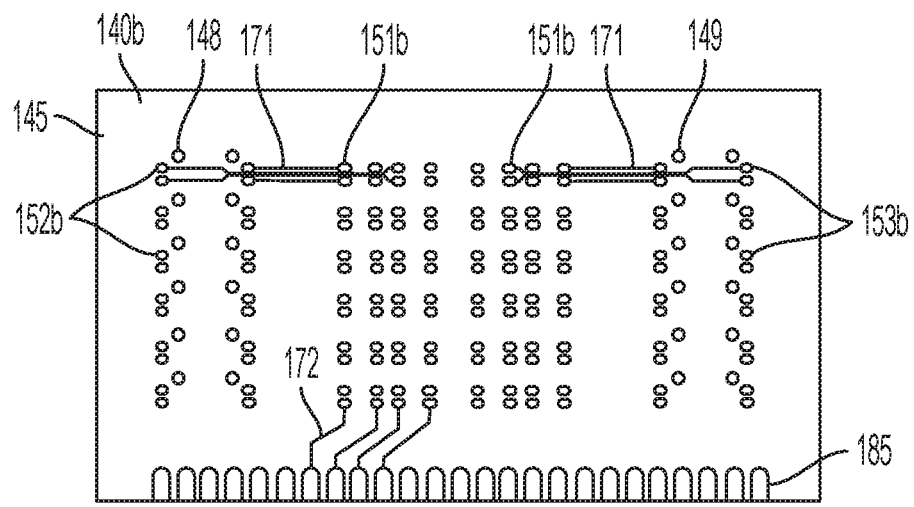
FIG. 2B is a plan view of the bottom surface of the interposer of the transceiver of FIG. 1A.
Figure 3A:
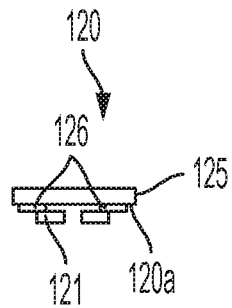
FIG. 3A is a side view of the optoelectronic receiver chip of the transceiver of FIG. 1A.
Figure 4A:
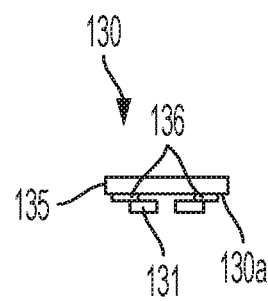
FIG. 4A is a side view of the optoelectronic transmitter chip of the transceiver of FIG. 1A.
Figure 5A:
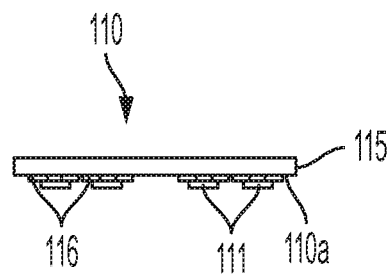
FIG. 5A is a side view of the electronic chip of the transceiver of FIG. 1A.
Figure 3B:
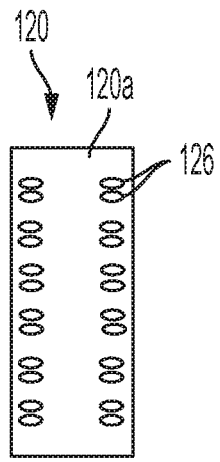
FIG. 3B is a plan view of the optoelectronic receiver chip of the transceiver of FIG. 1A showing the contact pads.
Figure 4B:
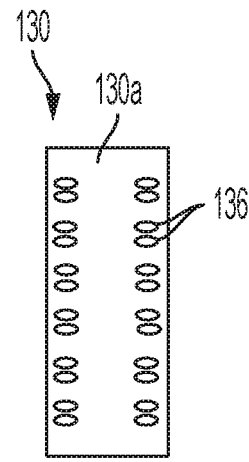
FIG. 4B is a plan view of the optoelectronic transmitter chip of the transceiver of FIG. 1A showing the contact pads.
Figure 5B:
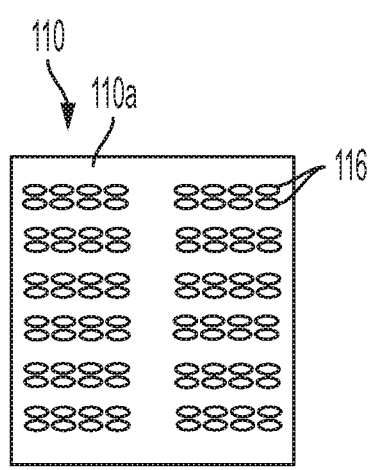
FIG. 5B is a plan view of the electronic chip of the transceiver of FIG. 1A illustrating the contact pads.

FIGS. 2A and 2B are plan views of the top surface 140a (FIG. 2A) and the bottom surface 140b (FIG. 2B) of the interposer 140 before the electronic and optoelectronic chips are placed thereon. FIG. 3A is a side view of the optoelectronic receiver chip 120. FIG. 3B is a plan view of the optoelectronic receiver chip 120 showing the contact pads 126. FIG. 4A is a side view of the optoelectronic transmitter chip 130. FIG. 4B is a plan view of the optoelectronic transmitter chip 130 showing the contact pads 136. FIG. 5A is a side view of the electronic chip 110. FIG. 5B is a plan view of the electronic chip 110 illustrating the contact pads 116.

As illustrated in FIGS. 1A-5B, electrically conductive microsprings 151, 152, 153 extend above the top surface 140a of the interposer 140. Each spring is electrically connected through the interposer substrate 145 to corresponding microspring contact pads 151b, 152b, 153b disposed on the bottom surface 140b. In some embodiments, the electrical trace lines for each springs are on intermediate layers sandwiched between the top and bottom surfaces of the interposer, or are placed on the same surface as the microsprings. The microsprings 151, 152, 153 are in physical contact with electrically conductive pads 116, 126, 136 disposed on the surfaces 110b, 120b, 130b of the electronic and optoelectronic chips 110, 120, 130. In this context it will be appreciated that the terms "top" and "bottom" are used to indicate opposite surfaces of a substrate and are not meant to imply any particular orientation of the substrates.

When the transceiver 100 is assembled, the conductive pads 116, 126, 136 of the electronic and optoelectronic chips 110, 120, 130 are positioned on the microsprings 151, 152, 153 as best seen in FIG. 1B, thereby making electrical connections between the electronic devices 111 of the electronic chip 110 and optoelectronic devices 121, 131 of the optoelectronic chips 120, 130. The electronic devices 111 and/or the optoelectronic devices 121, 131 may be positioned on the same side of the substrate as the conductive pads 116, 126, 136 or may be positioned on the opposite side of the substrate from the conductive pads 116, 126, 136. In the embodiment shown in FIGS. 1A through 5B, the microsprings 151, 152, 153 are disposed on the interposer 140 and the pads 116, 126, 136 are disposed on the chips 110, 120, 130. However, it is also possible in other embodiments for the microsprings to be disposed on the electronic and optoelectronic chips and the contact pads to be disposed on the interposer. In some embodiments, each of the electronic chip, optoelectronic chips, and the interposer could include both microsprings and contact pads.

As best seen in FIGS. 1A through 2B, the interposer 140 includes an interposer substrate 145 where the microsprings 151, 152, 153 are formed on a top surface 140a of the interposer substrate. In the illustrated embodiment, the structure of the microsprings 151, 152, 153 extends through the substrate 145 and there are microspring contact pads 151b, 152b, 153b disposed on the bottom surface 140b of the interposer substrate 145. The interposer substrate 145 may be a portion of a silicon wafer, for example. Other suitable materials for the interposer substrate 145 may include glass or a glass-reinforced epoxy laminate material such as FR4. Formation of the microsprings 151, 152, 153 on the interposer substrate 145 is discussed in further detail below.

Interposer 140 shown in FIGS. 2A and 2B includes a first set 161 of microsprings configured to make electrical contact with the contact pads 116 formed on the surface 110a of the substrate 115 of the electronic chip 110 shown in FIGS. 5A and 5B. Interposer 140 includes a second set 162 of microsprings configured to make electrical contact with the electrical contact pads 126, 136 formed on surfaces 120a, 130a of the substrates 125, 135 of the optoelectronic receiver chip 120 and the optoelectronic transmitter chip 130 shown in FIGS. 3A, 3B and FIGS. 4A, 4B. As indicated in FIG. 2A, first set 161 of microsprings includes microsprings 151 and the second set 162 of microsprings includes microsprings 152 and 153.

The first set 161 of microsprings is electrically connected to the second set 162 of microsprings. For example, in some embodiments, the tips of the microsprings 151, 152, 153 (see FIG. 2A) may be at or above the top surface 140a of the substrate 145 with a microspring contact pads 151b, 152b, 153b accessible at the bottom surface 140b of the substrate 145 (see FIG. 2B). Alternatively or additionally, in some embodiments, the tips of the microsprings may be at or above the top surface of the substrate with a microspring contacts also accessible at the top surface. Electrical traces 171 can be deployed on the top and/or bottom surfaces 140a, 140b of the interposer substrate 145 to electrically connect the first set 161 of microsprings with the second set 162 of microsprings. In some embodiments, the traces can be on an interlayer sandwiched between the top and bottom surfaces. In some embodiments, as depicted in FIG. 2B, traces 171 are disposed on the bottom surface 140b of the interposer to electrically connect the microspring contact pads 151b to the microspring contact pads 152b, 153b.

The interposer 140 may also include electrically conductive contact pads 185 on the top and/or bottom surfaces 140a, 140b of the interposer substrate. The contact pads 185 can be electrically connected, e.g., via traces 172 to at least the contact pads 151b of the microsprings 151. For example, the contact pads 185 may be arranged on an edge of the interposer 140 as an edge connector. The transceiver 100 supports microwave speed communications, thus traces 171, 172, microsprings 151, 152, 153 and contact pads 116, 126, 136 may be configured as microwave transmission lines.

As depicted in FIGS. 1B-2B, the interposer 140 includes holes 148, 149 that extend through the interposer 140. The holes 148, 149 are aligned with the optoelectronic devices 121, 131 and are configured to receive and align optical fibers 175 such that the optical fibers 175 are optically coupled to the optoelectronic devices 121, 131. Optionally, microlenses 190 may be disposed between the optoelectronic devices 121, 131 and the optical fibers 175 to facilitate the optical coupling between the optoelectronic devices 121, 131 and optical fibers 175.

As illustrated in FIGS. 3A and 3B, the optoelectronic receiver chip 120 includes a substrate 125 with optoelectronic receiver devices 121, e.g., an array of p-i-n photodetectors formed in and/or on the optoelectronic receiver chip 120. The photodetectors 121 are electrically connected to electrical contact pads 126 disposed on the surface 120a of the substrate 125. Contact pads 126 are configured to engage with the microsprings 152 on the interposer 140.

As illustrated in FIGS. 4A and 4B, the optoelectronic transmitter chip 130 includes a substrate 135 with optoelectronic transmitter devices 131, e.g. an array of lasers such as vertical cavity surface emitting lasers (VCSELs), formed in and/or on the optoelectronic transmitter chip 120. The lasers 131 are electrically connected to electrical contact pads 136 disposed on the surface 130a of the substrate 135 and are configured to engage with the microsprings 153 on the interposer 140.

As illustrated in FIGS. 5A and 5B, the electronic transmitter chip 110 includes a substrate 115 with electronic devices 111, e.g. an array transimpedance amplifiers (TIAs) configured to receive electrical signals from the photodetectors and array of drivers configured to drive the lasers, formed in and/or on the electronic chip 110. The amplifiers and/or drivers 111 are electrically connected to electrical contact pads 116 disposed on the surface 110a of the substrate 115 and are configured to engage with the microsprings 151 on the interposer 140.

Due to differences in material systems used for the electronic devices 111 and the optoelectronic devices 121, 131, the material of the substrate 115 of the electronics chip 110 is typically different from the material(s) of the substrates 125, 135 of the optoelectronic chips 120, 130. For example, the substrate 115 of the electronics chip 110 may comprise Si or SiGe and the substrate 125, 135 of one or both of the optoelectronic chips 120, 130 may comprise GaAs, InP, or Si (photodetector).

As best seen in FIG. 4B, the contact pads 136 for the optoelectronic transmitter chip 130 may be interdigitated along two columns and spaced on 125 µm linear pitch. This arrangement corresponds to the spacing needed for 250 µm diameter multi-mode optical fibers and can be easily accommodated by the microsprings 153 of the interposer 140. The p-i-n photodetectors have a similar geometrical layout as the lasers. The TIA and the laser driver array are custom-designed combo mixed signal chip. The edge bandwidth assumes signal transfer with a 5-mm×5-mm MCM with I/O pads along all four edges of the chip.

Figure 6A:
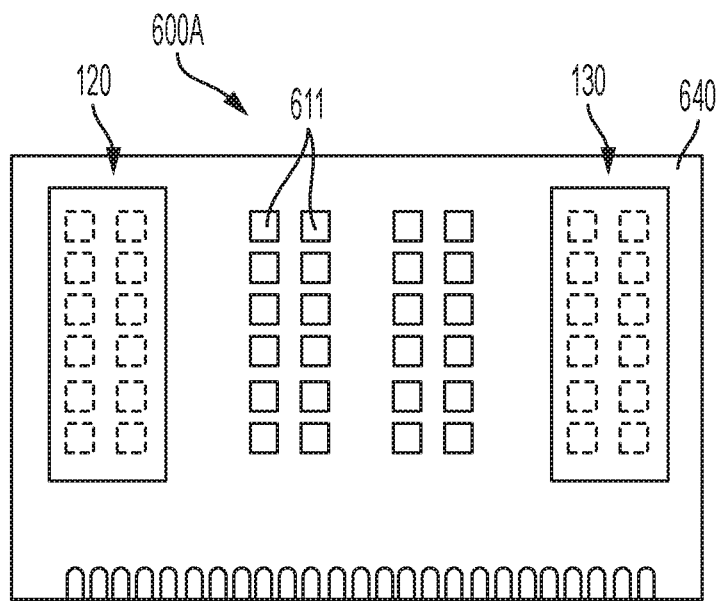
FIG. 6A is a plan view of a transceiver having electronic devices fabricated directly in and/or on the interposer substrate in accordance with some embodiments.

FIG. 6A is a plan view of a transceiver 600A in accordance with some embodiments. As illustrated in FIG. 6A, at least some of the devices, e.g., electronic devices 611 can be formed in and/or on the interposer 640a itself. In some embodiments, at least some of the optoelectronic devices may be alternatively or additionally formed on the interposer 640. Forming components directly on the interposer may eliminate the need for a separate electronic chip and/or a separate optoelectronic chip in some configurations.

Figure 6B:
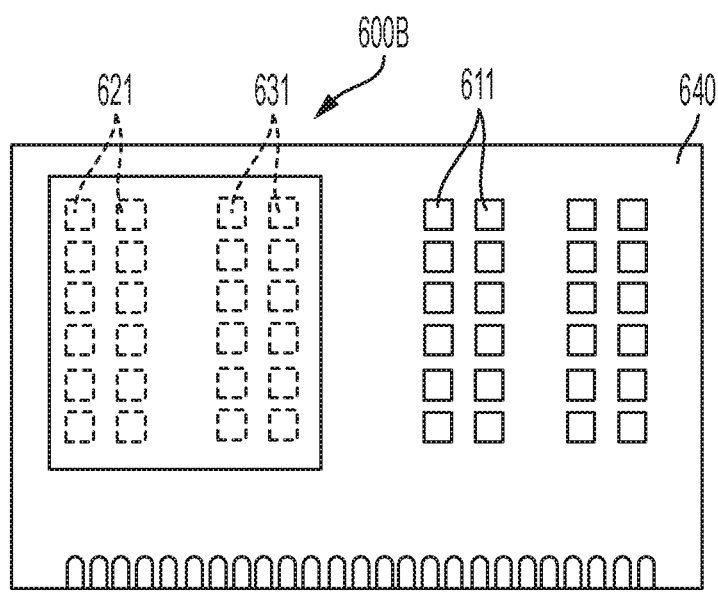
FIG. 6B is a plan view of a transceiver that has only one optoelectronic chip with optoelectronic receiving and transmitting devices disposed in or on the optoelectronic chip substrate in accordance with some embodiments.

In some embodiments, as illustrated by the transceiver 600B of FIG. 6B, there may be only one optoelectronic transmitter/receiver chip 620 that includes both photodetectors 621 and photoemitters 631. Other configurations are possible.

Figure 7A:
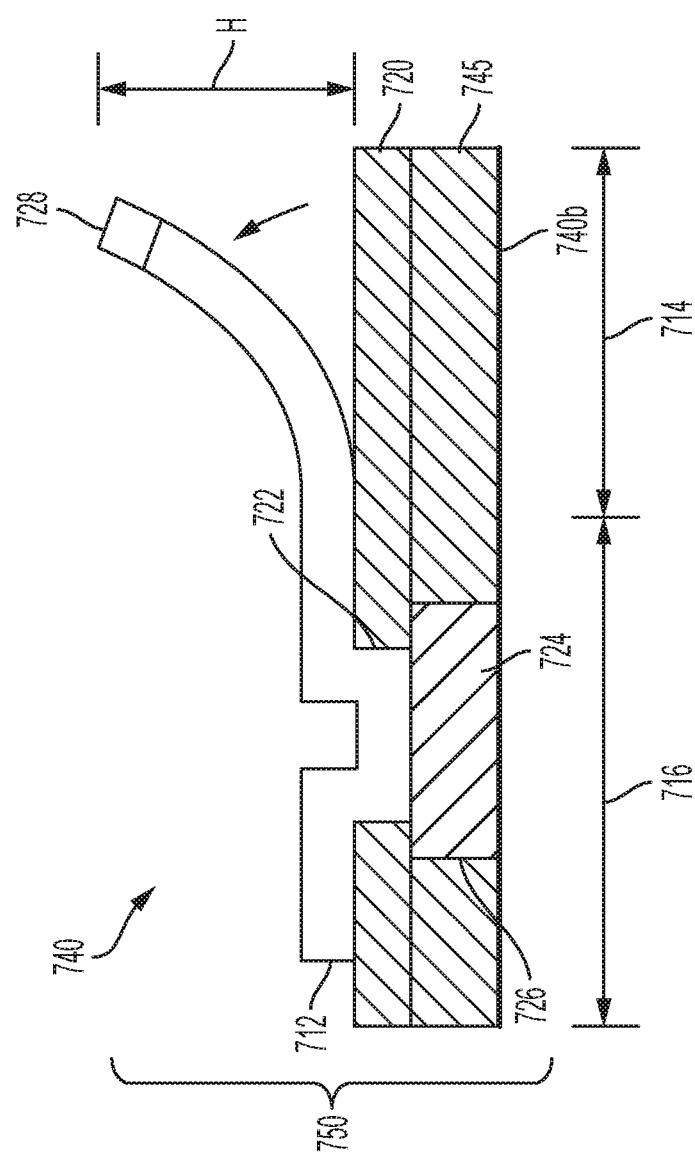
FIGS. 7A through 7C are a sequence of diagrams that illustrate the structure and formation of the interposer and microsprings in accordance with some embodiments.
Figure 7B:
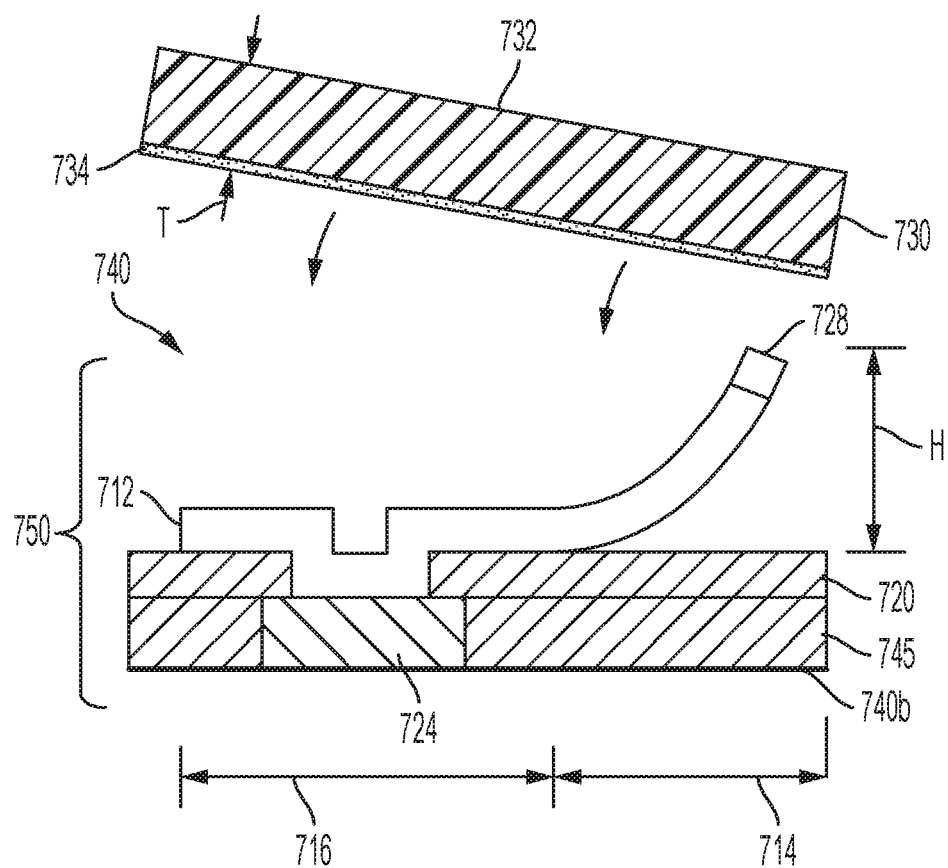
Figure 7C:
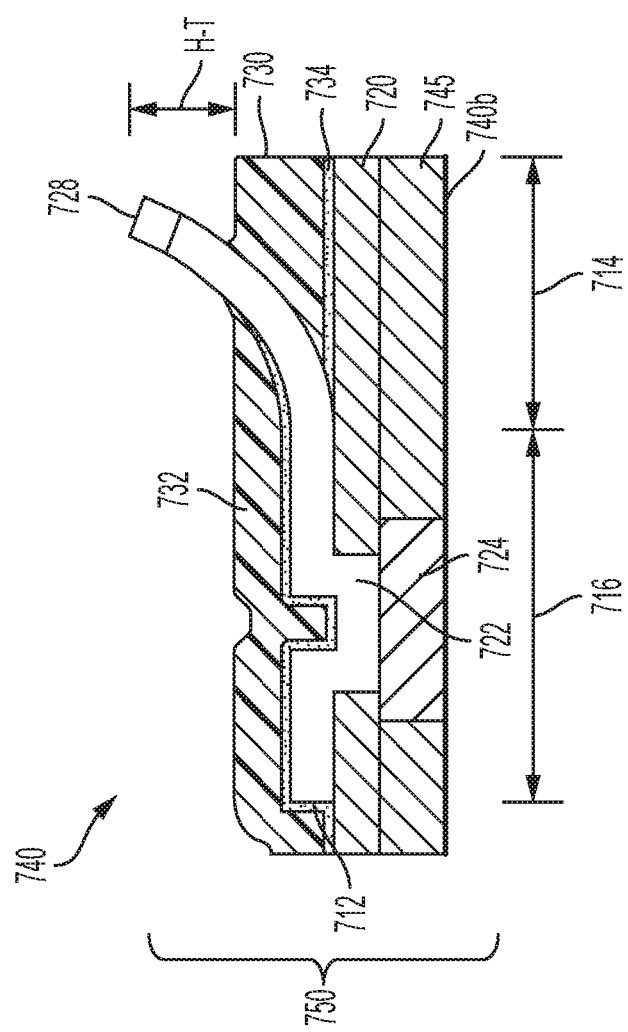

FIGS. 7A through 7C describe in more detail the structure and formation of the interposer 140 and microsprings 151, 152, 153 in accordance with some embodiments. FIG. 7A illustrates in side view a portion of one embodiment of an interposer 740, that includes a microspring 750 providing top- and bottom surface contact as previously described. There are a number of different microspring structures that may be employed for an interposer as disclosed herein. The choice of microspring design, materials, physical properties, etc. will be determined by many factors, and does not limit the generality of a microspring-based interposer design disclosed herein. While interposer 740 will typically include a plurality of microsprings, only one such microspring 750 is shown for ease of explanation.

Microspring 750 comprises a free portion 714 and an anchor portion 716 fixed to substrate 745 (e.g., glass, silicon, quartz, etc.). Prior to formation of microspring 750, a dielectric layer 720 may be formed over the surface of substrate 745, and an opening 722 formed therein. Microspring 750 is formed such that it is electrically connected to a contact 724, formed for example in a via 726 in substrate 745, such as through opening 722. Contact 724 is exposed at the bottom surface 740b of the substrate. The connection between top portion 712 of the microspring 750 and contact 724 may provide both electrical intercommunication therebetween as well as physical connection further securing top portion 712 of the microspring 750 to substrate 745. Furthermore, top portion 712 of microspring 750 may be connected to substrate 745 only at contact 724. In still other embodiments, the top portion 712 of the microspring 750 is formed over and affixed to a separate anchor (not shown) which itself is attached to substrate 745, with or without a separate electrical contact.

The top portion 712 of microspring 750 may be made of an elastically deformable material, such as a molybdenum-chrome (MoCr) alloy, a nickel-zirconium (NiZr) alloy, or any of a variety of metals or alloys suitable for the creation of microsprings, such as Mo, MoCr, W, Ni, NiZr, Cu, diamond, or other alloys, non-metals, oxides, nitrides or organic materials. Preferably, the material from which microspring 750 is formed is electrically conductive, although it may be formed of a non-conductive or semi-conductive material. If formed of a non-conductive or semi-conductive material, microspring 750 may be coated or plated with an electrically conductive material, not shown, so as to provide an electrically conductive contact.

The top portion may be initially formed from a stress-engineered metals system in a plane that is roughly parallel to the plane of the surface of substrate 745. Formation is typically by photolithographic techniques well known in the art. The stress-engineered metal film (i.e., a metal film fabricated to have a stress differential such that its lower portions have a higher internal compressive stress than its upper portions) is typically patterned by photolithography to form top portion 712. According to one technique, different materials are deposited in layers, each having a desired stress characteristic, for example a tensile layer formed over a compressive layer. According to another technique a single layer is provided with an intrinsic stress differential by altering the fabrication parameters as the layer is deposited.

One of a variety of techniques, such as etch undercutting, is employed to release the free portion 714 of microspring 750, including tip 728, and the internal stress within microspring top portion 712 causes tip 728 to pull up out of plane, creating for example a concave microspring profile as shown in FIGS. 7A through 7B. The microspring 750 may be designed to achieve different microspring profiles depending on the application.

In a typical embodiment, tip 728 rises to a height, H, above the surface of layer 720 on the order of 5-1000 µm. The width of microspring top portion 712 is typically in the range of 5-100 µm. Tip 728 may be pointed, rounded, flat or other shape, as will be understood by one skilled in the art.

With reference to FIGS. 7B and 7C, once free portion 714 is released, a thin laminate structure 730 can be applied over the upper surface of microspring 750. Thin laminate structure 730 may be formed of a variety of different materials intended to be permanently applied over microspring 750. Silicone is one exemplary material. Silicone is relatively soft and conformal, which is advantageous as will be appreciated from the description below. Another candidate material is known in the trade as Gel-Film, available from Gel-Pak, a division of Delphon Industries, LLC. For clarity, in this embodiment structure 730 is referred to as a "laminate" structure since in the process of forming the device it is applied, or laminated, over the already-formed microspring and substrate structure. Laminate structure 730 may be comprised of a single material, or may itself be a laminate of several material layers. In certain embodiments, laminate structure 730 may be handled via a carrier sheet (not shown), and transferred off said sheet during application. Laminate structure 730 is of a thickness T. In this embodiment, the laminate thickness T will be less than the height H of microspring 750, although in certain embodiments this may not be the case, at least initially. In other embodiments, such as described below, T may exceed H.

Thin laminate structure 730 is removed from its backing, and applied over the upper surface of microspring 750 such that tip 728 of microspring 750 pierces through laminate structure 730. Microspring 750 is undamaged due to the fact that tip 728 is quite small and relatively sharp, and the laminate is relatively soft. Appropriate pressure is applied to the upper surface 732 of structure 730 such that structure 730 generally conforms to the topography of the top surface of microspring 750 and is well-seated thereover. An optional adhesive layer 734 on the under surface of laminate structure 730 which contacts the upper surface of microspring 459 (e.g., a part of the upper surfaces of microspring 750 and dielectric layer 720) may retain laminate structure 730 in place. In one embodiment it is advantageous to employ a soft, conformal material for structure 730 so that microspring 750 is not damaged in the process of piercing structure 730, and further so that structure 730 can contact a large portion of the non-planar upper surface of microspring 750.

Tip 728 of microspring 750 then extends above the upper surface 732 of structure 730 by a distance approximately equal to H-T. Exposed tip 728 can then be used as an electrical contact on a first, or top side of interposer structure 740.

It should be noted here that the amount H-T by which tip 728 extends over the surface 732 of laminate structure 730 is important for controlling the mechanical properties of microspring 750 for use as an electrically conductive pressure contact. If that part of microspring 750 extending over surface 732 is close to perpendicular to the plane of substrate 745 (i.e., at a high angle), the upper portion 710 of microspring 750 may not be sufficiently able to "roll" or smoothly deflect, and thus exhibit little compliance. However, the laminate structure 730 may provide some compliance, depending on the material from which it is formed, the height H-T, the actual angle of tip 728 relative to the contact surface, etc. For example, with laminate structure 730 formed of silicone, and roughly 100 µm thick, and with the amount H-T by which tip 728 extends over the surface 732 in the range of 5-10 µm, more than 10 µm of compliance could be provided.

In certain embodiments it may be desirable to soften structure 730 prior to application, for example to provide a more conformal covering over the surface of microspring 750, to further reduce the likelihood of damage to microspring 750 as it pierces structure 730, etc. Softening of structure 730 may be accomplished by heating, by chemical softening, or by other methods as may be known in the art. Furthermore, structure 730 may be comprised of a curable material such as a photo-curable epoxy or polymer. Initially, structure 730 is applied is a partly cured state such that it can maintain its physical structure, but is sufficiently soft so as to be conforming, relatively easy for microspring 750 to pierce, etc. Once applied, the curing of structure 730 can be completed, thereby providing a more rigid body in which microspring 750 is embedded. Still further, materials which can be softened after application over microspring 750 may be used such that they are more rigid when disposed over microspring 750, for example to protect microspring 750, but which can be softened by heat, chemical treatment, etc. to facilitate removal from microspring 750.

At least a part of microspring 750, and specifically a part free portion 714 is disposed "within" laminate structure 730. It is one function of laminate structure 730 to physically support microspring 750. This support can be strength in all directions as the wafer bearing microspring 750 is handled, strength in the direction of deflection when microspring 750 is in spring-contact with a device thereover, and so on. Accordingly, laminate structure 730 should substantially be in contact with the surface of microspring 750, with few gaps therebetween. Laminate structure 730 may have some "give" or tolerance for deflection of microspring 750 while still providing overall added strength to microspring 750.

Laminate structure 730 may also act as a spacer, defining a minimum spacing between the upper surface of substrate 745 (or dielectric layer 720) and the lower surface of a structure contacting tip 728. Still further, laminate structure 730 may provide additional strength to the anchor between the top portion 712 of the microspring 750 and substrate 745, in part due to large surface contact area and adhesion to both, as well as the adhesion provided by adhesive layer 734. Structure 730 further provides a gap stop during spring deflection. While structure 430 does allow some give, a limit is reached at which the material resists further deflection of microspring 450. At this point, the smallest gap between microspring 750 and a device in contact therewith is thereby defined. Furthermore, structure 730 additionally provides a moisture and contaminant barrier, protecting a portion of microspring 750, dielectric layer 720, contact 724, etc., from environmental contamination and damage. Still further, the portion of microspring 750 embedded within laminate structure 730 is protected from chemical processing steps such as plating and soldering, that may be required in certain applications. Additional discussion of the structure and fabrication of interposers and microsprings that are applicable to the embodiments described herein can be found in U.S. Pat. Nos. 7,550,855, 8,441,808, and 8,519,534 which are incorporated herein by reference.

Figure 8A:
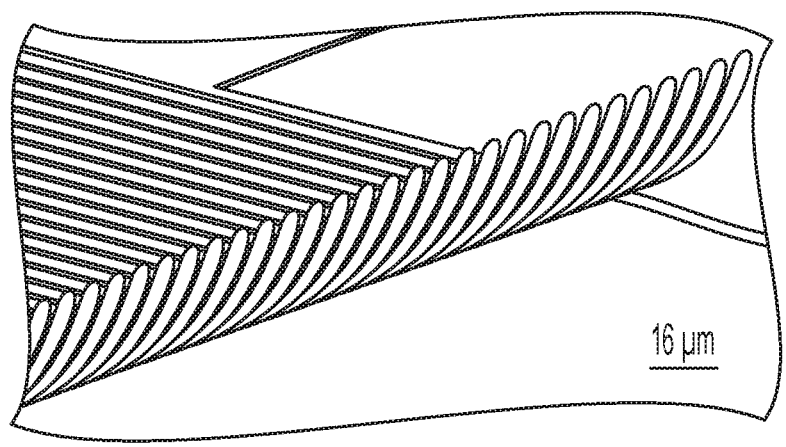
FIGS. 8A and 8B show scanning electron microscope (SEM) images of microsprings in accordance with some embodiments.
Figure 8B:
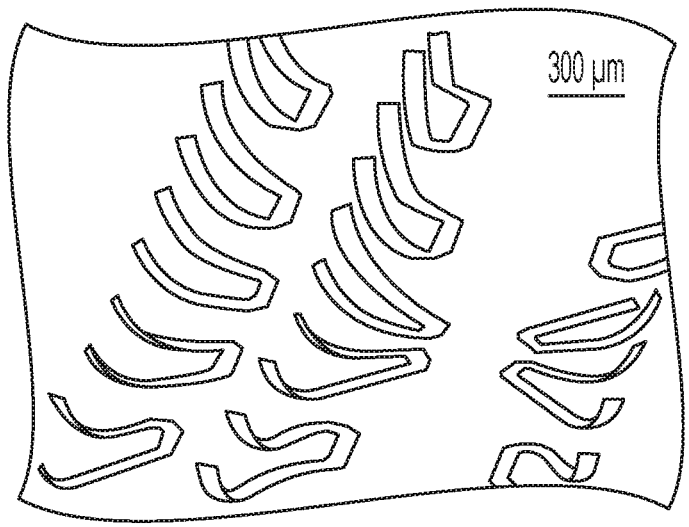

FIGS. 8A and 8B show scanning electron microscope (SEM) images of microsprings in accordance with some embodiments. As discussed above, the finger-like 3D structures are formed by depositing a metal thin film, so the metal film possesses intrinsic compressive stress near the substrate and tensile stress near the surface. When released from the substrate, the built-in stress gradient causes the patterned structures to curl up into compliant springs. The microsprings can be electroplated with additional metal to increase electrical conductivity or to achieve a desired mechanical property. The springs can be fabricated on any flat substrates such as glass, Si wafers, or FR4. They can be designed to be as small as 4 µm wide on a 6 µm pitch to larger than 200 µm wide and can have lift heights ranging from just a few microns off the substrate to nearly 1 mm high. They can also be formed as microwave transmission lines for high speed signaling.

Figure 9:
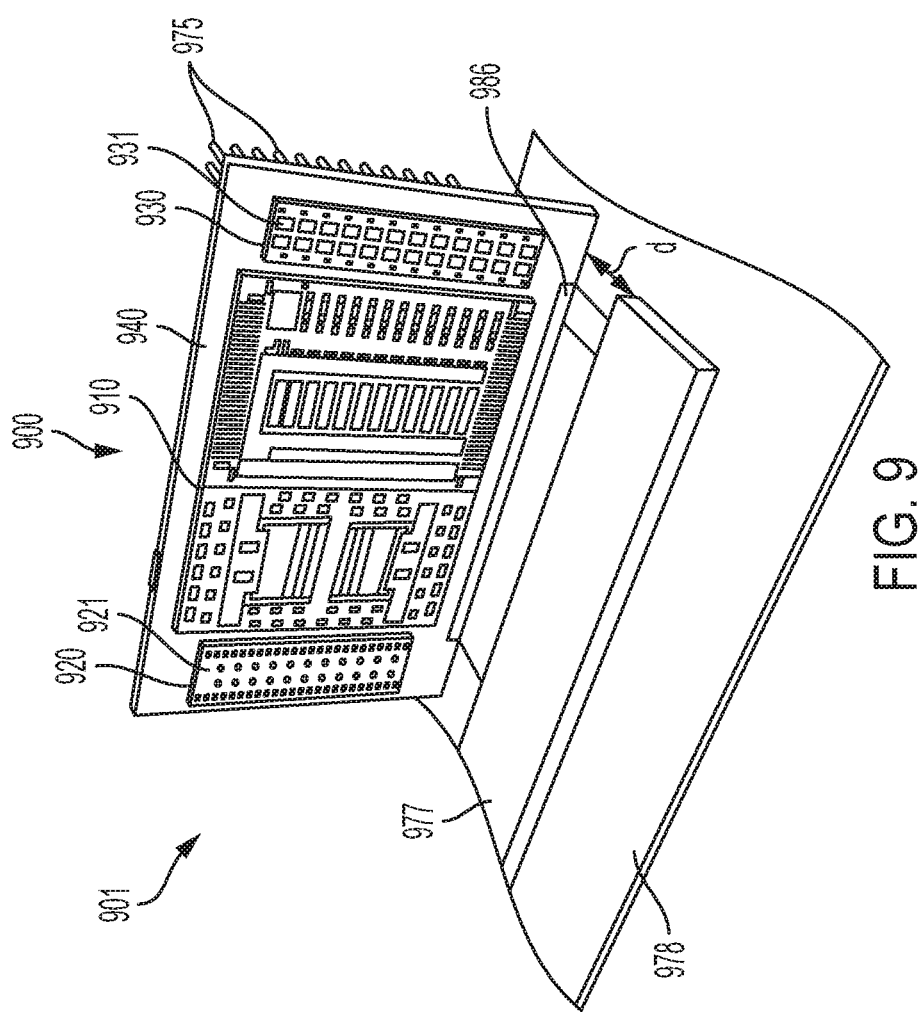
FIG. 9 is a block diagram of a communication system employing a transceiver in accordance with some embodiments.

The dimensions of the chip-scale transceivers as disclosed herein, e.g., transceiver 100 can be in the cm-size range. Such transceivers can support a bandwidth of 2.4 Tbps and reduce energy consumption to less than about 3 pJ per bit or even less than about 1 pJ per bit. The transceivers are scalable to densely packed multi-port configurations that achieve aggregate bandwidths of over 100 Tbps. The edge bandwidth density can be greater than about 1 Tbps per cm, e.g., the edge bandwidth density can be 2 Tbps per cm. In FIG. 9, the edge bandwidth density assumes signal transfer with a 5-mm×5-mm MCM with electrical I/O pads along one edge of the chip.

According to some embodiments the disclosed chip-scale packaged transceiver may use embedded 24-lane pulse amplitude modulation (PAM), e.g., PAM4 modulation at 25 Gbps per lane or even 100 Gbps per lane for an aggregate bandwidth of 2.4 Tbps, operating at 2.4 watts, or 1 pJ per bit. The size of the transceiver can be less than or equal to 10×8×5 mm$^3$ and/or 0.17 mm$^3$ per Gbps in some implementations. The signal transmitting elements may be co-packaged vertical-cavity surface-emitting lasers (VCSELs) modulated at 50 Gbaud via integrated external optical modulators. External modulators refer to components external to the laser that modulate laser light that passes through the component, as opposed to "direct modulation", where the light output is controlled by direct manipulation of the electrical current that drives the laser. External modulators enable faster modulation speeds but are more complex. Integrated external optical modulators are external modulators that are integrated or co-fabricated with the laser array on the laser chip.

FIG. 9 illustrates a communication system 901 implemented using the chip-scale transceiver discussed above. The communication system 901 includes a transceiver 900 comprising an interposer 940, electronics chip 910, optoelectronic receiver chip 920, and optoelectronic transmitter chip 930 as previously discussed above. Optical fibers 975 extend through holes (not shown) in the interposer 940. The holes are arranged such that the optical fibers 975 are optically coupled with the photodetectors 921 on the optoelectronic receiver chip 920 and photoemitters 931 on the optoelectronic transmitter chip 930. The system 901 includes a network interface device 977, e.g. an application specific integrated circuit (ASIC) comprising electronic devices configured to control flow of data to and from the transceiver 900. For example the network interface ASIC may include circuitry for encoding data and/or decoding received data. The network interface ASIC 977 and the transceiver 900 are electrically coupled together through a circuit board such as a motherboard 978 or backplane. For example, the transceiver 900 may have edge contacts along the edge of the interposer substrate 940 and the circuit board 978 may have an edge connector socket 986 configured to receive and electrically connect to the edge contacts of the transceiver 900. Electrical traces running in and/or on the circuit board 978 electrically connect the devices 911 of the transceiver electronics chip 910 to the devices of the network interface ASIC 977.

As previously discussed, the highly integrated transceiver 900 shown in FIG. 9 can be used to eliminate the legacy face-plate pluggable optical modules. This approach moves the optoelectronic chips "into the equipment box" close the motherboard/backplane 978 and provides optical I/O capability down to the multi-chip module (MCM)-level. For example, the transceiver 900 can be directly plugged to the motherboard/backplane 978, e.g., via the edge card connector socket, such that the transceiver is located a distance, d, less than about 5 cm from the network interface ASIC 978.

FIGS. 10A through 10C illustrate a method of making a transceiver for use in a communication system as discussed above. The transceivers can comprise VCSEL array and photodetector array chips co-packaged with a low power TIA and laser driver electronics. The disclosed transceiver is made using wafer-level packaging methods, where the hybrid transceiver modules are formed at the wafer level before interposer singulation. The micro-springs and access holes for optical fibers can be batch-fabricated at wafer scale. Optical I/O signals transfer via parallel optical fibers. The optical fibers may be aligned and attached to the chip-scale-package through backside holes formed at appropriate locations on the interposer wafer, with microlenses optionally used as optical coupling elements.

As illustrated in FIG. 10A, a method includes fabricating microsprings on a wafer 1005 which forms the substrate for multiple interposers 1040. The springs are made using low cost parallel wafer-scale micro-fabrication thin film processes. The interposers 1040 comprise stress-engineered electrically conductive microsprings 1050 disposed on a surface of the interposer wafer 1005. Edge contacts 1085 are formed on the wafer 1005 at edges of each individual interposer 1040. Holes that can be aligned with optoelectronic devices are formed through the interposers 1040. The wafer 1005 depicted in FIG. 10A has multiple interposers 1040 formed thereon.

Referring to FIG. 10B, the method includes the formation of multiple electronic chips 1010 and multiple optoelectronic chips 1020, 1030. The electronic chips 1010 include electronic devices, e.g., transimpedance amplifiers and laser drivers, formed using a process and architecture suitable for the devices. The multiple optoelectronic chips include optoelectronic devices, e.g., photodetectors and VCSELs, formed using processes and architectures typically different from those used for the electronic devices. In some embodiments, the substrate material used for the electronic devices may be the same as the substrate material used for the optoelectronic device. For example, both the driver electronics and the photodetector may be silicon-based, or both the driver electronics and the laser chip may be GaAs-based. The interposer substrate may be made of a third material different from the first and second materials. In some embodiments, two different types of optoelectronics chips may be fabricated, e.g., optoelectronic transmitter chips comprising photoemitter devices and optoelectronic receiver chips comprising photodetector devices. In this configuration, the substrate material of the optoelectronic transmitter chip may differ from the substrates material of the optoelectronic receiver chip.

Electrical contact pads are formed on the substrates of the electronics chips, the electrical contact pads on the electronic chips arranged to make electrical contact with first microsprings of the interposers. Electrical contact pads are formed on the substrates of the optoelectronics chips, the electrical contact pads on the optoelectronic chips arranged to make electrical contact with the second microsprings of the interposers.

Multiple transceivers are formed on the wafer by assembling the electronic and optoelectronic chips to the interposers fabricated on the wafer before die singulation. Assembly includes bringing the contact pads on the electronic and optoelectronic chips into physical contact with the microsprings on the interposers on the wafer such that electrical connections are made. The photoemitter and photodetector devices of the optoelectronics chips 1020 are aligned with the holes in the interposers 1040.

After the wafer-scale assembly of the transceivers 1000, the interposer wafer 1005 is cut to singulate the individual transceivers 1000. FIG. 10B shows a transceiver 1000 after singulation.

The transceivers can be deployed as part of a communication system as previously described. Optical fibers are placed through the holes in the interposer 1040. The holes serve to stabilize and align the optical fibers with the photodetector and/or photoemitter devices on the optoelectronic chips 1020, 1030. FIG. 10C shows the a communication system 1001 that includes a transceiver 1000 inserted into an edge connector socket 1086 on a motherboard near a network interface ASIC. The optical fibers are shown extending from the bottom of the interposer 1040.

As shown in FIG. 10C, the microspring interconnects allow the disclosed chip-scale-packaged transceivers 1000 to be placed very close to the network interface ASIC on the motherboard. This architecture enables the physical media dependent (PMD) electronics, VCSEL driver, and TIA devices which are fabricated on the electronic chip to connect directly with the network interface ASIC. Consequently, the transceiver electronic chips can take advantage of very low-power techniques to manage pre-emphasis, clock data recovery (CDR), error correction, and electronic compensation functions. This is possible because the distance between the network interface ASIC and the electronic chip of the transceiver is short and the electrical inputs from the network interface ASIC do not have to traverse the length of a network switch or server line card, as in the case of legacy photonics I/O links. The combination of small chip-scale integrated packaging, the close proximity of the transceiver to the switch ASIC, and the use of low power mixed signal analog circuit design nodes in SiGe and CMOS processes enables the low power consumption of the of transceiver, e.g., about 2.4 watts per transceiver.

In one embodiment, the optical signal generation source is a 24-lane 12×2 VCSEL array integrated with an electroabsorption modulator (EAM) in a single chip. The laser diode portion of the device may have the same device structure as a more conventional direct modulated laser and can operate under continuous wave conditions. The light output intensity is modulated by applying an input voltage signal across the EAM portion of the device. Since the rate-limiting material properties of the laser itself are not affected by the modulation process, optical modulation can be performed at higher speeds (50 Gbps non-return to zero (NRZ) or 50 Gbaud, 100 Gbps PAM4) than possible if the lasers were directly modulated. This structure provides a bandwidth per module of 1.2 Tbps NRZ I/O or 2.4 Tbps PAM4 I/O.

In another embodiment, the driver electronics utilize PAM4 modulation by adding a 2-bit digital-to-analog converter (DAC) direct modulation output to the network interface ASIC. The VCSEL array then operates at 50 Gbaud, 100 Gbps per lane to achieve a bandwidth of 2.4 Tbps per I/O module. The estimated power requirement of the I/O link is less than about 3 Watts, e.g., 2.9 Watts or even 2.4 Watts. Together with the higher bandwidth supported by PAM4, the power budget brings the energy consumption to 1 pJ/bit. The transceiver architecture discussed herein is compatible with further doubling in bandwidth as future signaling standards such as PAM8 are developed and gain industry acceptance.

The link latency of the physical layer in the transmitter, including the VCSEL driver electronics and the TIA amplifier, is estimated to be less than 1 ns. The embodiment using PAM4 modulation increases latency somewhat, but the latency will still be less than 5 ns when the transceivers use analog signal processing approaches, rather than conventional longer latency digital signal processing (DSP) approaches.

The transceiver disclosed herein is readily scalable to multi-port configurations to achieve aggregate bandwidths exceeding 100 Tbps and can be customized for applications ranging from inter-chip communication within PCB boards to top-of-rack communication between servers in datacenters. The level of photonic integration excludes the digital network interface ASIC in order to maintain compatibility with existing interface standards, so the improved I/O performance can be applicable to a wide range of IC cores without requiring fundamental changes to the IC technology themselves. The concept can be extended in future architectures to include the network interface ASIC into the chip-scale transceiver module, if desired.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:
1. A transceiver comprising:
an interposer comprising:
    an interposer substrate; and
    first and second microspring electrical contacts disposed on the interposer substrate;
at least one electronic chip comprising:
    an electronic chip substrate;
    electronic devices disposed in and/or on a surface of the electronic chip substrate, the electronic devices comprising at least one of an amplifier array and a laser driver array; and
first electrical contact pads disposed on the electronic chip substrate, the first electrical contact pads arranged to make electrical contact with the first microsprings of the interposer;
at least one optoelectronic chip, comprising:
    an optoelectronic chip substrate;

optoelectronic devices disposed in and/or on the optoelectronic chip substrate, the optoelectronic devices comprising at least one of a laser array and a photodetector array; and second electrical contact pads disposed on the optoelectronic chip substrate, the second electrical contact pads arranged to make electrical contact with the second microsprings of the interposer, wherein the transceiver has an area less than or equal to 0.17 mm² per Gbps.

2. The transceiver of claim 1, wherein:
the electronic chip substrate comprises a first material; and
the optoelectronic chip substrate comprises a different second material.

3. The transceiver of claim 1, wherein the transceiver is configured to operate 24 communication lanes, each communication lane configured to operate at greater than or equal to 25 Gbps.

4. The transceiver of claim 1, wherein the transceiver operates at less than or equal to about 10 pJ per bit.

5. The transceiver of claim 1, wherein the transceiver operates at less than or equal to about 1 pJ per bit.

6. The transceiver of claim 1, further comprising holes through the interposer substrate that are aligned with the optoelectronic devices, the holes configured to receive and align optical fibers such that the optical fibers are optically coupled to the optoelectronic devices.

7. The transceiver of claim 1, wherein a volume of the transceiver is less than or equal to 10×8×5 mm³.

8. The transceiver of claim 1, wherein the interposer substrate comprises silicon, glass, or FR4.

9. The transceiver of claim 1, wherein the interposer substrate is a singulated portion of a silicon wafer.

10. The transceiver of claim 1, wherein the optoelectronic devices comprise an array of vertical cavity surface emitting lasers (VCSELs).

11. The transceiver of claim 1, wherein the interposer comprises contact pads arranged along at least one edge of the interposer.

12. The transceiver of claim 11, wherein the edge contact pads have a bandwidth density of greater than 1 Tbps per cm.

13. The transceiver of claim 1, wherein the optoelectronics module further includes microlenses disposed between at least some of the optoelectronics components and the optical fibers.

14. The transceiver of claim 1, wherein the at least one optoelectronic chip comprises:
an optoelectronic receiver chip that includes an array of photodetectors; and
an optoelectronic transmitter chip that includes an array of VCSELs.

15. The transceiver of claim 1, wherein the transceiver operates at less than or equal to about 1 pJ per bit.

16. The transceiver of claim 1, wherein a volume of the transceiver is less than or equal to 10×8×5 mm³.

17. A communication system comprising:
a transceiver comprising:
an interposer comprising:
an interposer substrate; and
first and second microspring electrical contacts disposed on the interposer substrate;
at least one electronic chip comprising:
an electronic chip substrate;
electronic devices disposed in and/or on a surface of the electronic chip substrate, the electronic devices comprising at least one of an amplifier array and a laser driver array; and
first electrical contact pads disposed on the electronic chip substrate, the first electrical contact pads arranged to make electrical contact with the first microsprings of the interposer;
at least one optoelectronic chip, comprising:
an optoelectronic chip substrate;
optoelectronic devices disposed in and/or on the optoelectronic chip substrate, the optoelectronic devices comprising at least one of a laser array and a photodetector array; and
second electrical contact pads disposed on the optoelectronic chip substrate, the second electrical contact pads arranged to make electrical contact with the second microsprings of the interposer,
wherein the transceiver has an area less than or equal to 0.17 mm² per Gbps;
a network interface device configured to control operation of the transceiver; and
a mother board comprising:
a first connector configured to electrically connect to the transceiver; and
a second connector configured to electrically connect to the network interface device, the motherboard having electrical traces configured to electrically connect the network interface device to the transceiver.

18. The system of claim 17, wherein the transceiver located less than 5 cm from the network interface device.

19. A method of making a transceiver, comprising:
forming multiple interposers on an interposer wafer, each interposer comprising first and second stress-engineered microspring electrical contacts disposed on a surface of the interposer wafer;
forming at least one electronic chip comprising:
fabricating electronic devices in and/or on a surface of an electronic chip substrate, the electronic devices comprising at least one of an amplifier array and a laser driver array; and
fabricating first electrical contact pads on the electronic chip substrate, the first electrical contact pads arranged to make electrical contact with the first microsprings of the interposer;
forming at least one optoelectronic chip, comprising:
fabricating optoelectronic devices in and/or on a surface of a optoelectronic chip substrate, the optoelectronic devices comprising at least one of a photodetector array and a laser array; and
fabricating second electrical contact pads on the electronic chip substrate, the second electrical contact pads arranged to make electrical contact with the first microsprings of the interposer, wherein the transceiver has an area less than or equal to 0.17 mm² per Gbps.

20. The method of claim 19, wherein forming the at least one optoelectronic chip comprises:
fabricating an optoelectronic receiver chip comprising the array of photodetectors; and
fabricating an optoelectronic transmitter chip comprising the array of lasers.

* * * * *